US010622769B2

(12) United States Patent
Zimmermann et al.

(10) Patent No.: US 10,622,769 B2
(45) Date of Patent: Apr. 14, 2020

(54) MODULAR INFRASTRUCTURE MANAGEMENT DEVICE

(71) Applicant: ZPE Systems, Inc., Fremont, CA (US)

(72) Inventors: Arnaldo Zimmermann, Dublin, CA (US); Livio Ceci, Fremont, CA (US)

(73) Assignee: ZPE Systems, Inc., Fremont, CA (US)

( * ) Notice: Subject to any disclaimer, the term of this patent is extended or adjusted under 35 U.S.C. 154(b) by 0 days.

(21) Appl. No.: 15/933,399

(22) Filed: Mar. 23, 2018

(65) Prior Publication Data

US 2018/0212377 A1    Jul. 26, 2018

Related U.S. Application Data

(63) Continuation-in-part of application No. 15/872,952, filed on Jan. 16, 2018, which is a continuation of application No. 15/862,582, filed on Jan. 4, 2018, now Pat. No. 10,164,385, which is a continuation of application No. 15/372,134, filed on Dec. 7, 2016, now Pat. No. 9,905,980, which is a continuation of application No. 15/063,838, filed on Mar. 8, 2016.

(60) Provisional application No. 62/144,870, filed on Apr. 8, 2015, provisional application No. 62/130,491, filed on Mar. 9, 2015.

(51) Int. Cl.
| H01R 24/64 | (2011.01) |
| H05K 5/02 | (2006.01) |
| H05K 5/03 | (2006.01) |
| H05K 7/14 | (2006.01) |

(52) U.S. Cl.
CPC .......... *H01R 24/64* (2013.01); *H05K 5/0204* (2013.01); *H05K 5/0247* (2013.01); *H05K 5/03* (2013.01); *H05K 7/1487* (2013.01); *H05K 7/1498* (2013.01)

(58) Field of Classification Search
CPC ...... G02B 6/4452; G02B 6/3897; H04Q 1/13; H04Q 1/136; H05K 7/1488; H05K 7/1492; H05K 7/1487; H05K 5/03; H05K 5/0204; H05K 5/0247; H01R 13/518; H01R 24/64
See application file for complete search history.

(56) References Cited

U.S. PATENT DOCUMENTS

| 6,805,560 B1 * | 10/2004 | Budny | H01R 12/52 439/65 |
| 6,924,986 B1 * | 8/2005 | Sardella | H05K 7/1429 361/785 |
| 7,077,710 B2 | 7/2006 | Haggay et al. | |
| 7,220,145 B2 | 5/2007 | Denovich et al. | |
| 2004/0229501 A1 | 11/2004 | Caveney et al. | |
| 2006/0223343 A1 * | 10/2006 | Campini | H05K 1/144 439/64 |

(Continued)

*Primary Examiner* — James Wu
(74) *Attorney, Agent, or Firm* — Horizon IP PTE. Ltd.

(57) ABSTRACT

A modular infrastructure management device comprises a housing and at least one circuit board. The housing includes a base plate, first modular slots disposed along the first edge of the base plate and second modular slots disposed along the second edge of the base plate. The first and second modular slots are configured to removably receive at least one first communication card module and at least one second communication card module. The circuit board is disposed on the base plate and comprises first and second connectors for electrically coupling to the first and second communication card modules.

19 Claims, 8 Drawing Sheets

(56) References Cited

U.S. PATENT DOCUMENTS

| | | | |
|---|---|---|---|
| 2007/0124529 A1* | 5/2007 | Carr | G06F 13/409 |
| | | | 710/317 |
| 2007/0165618 A1 | 7/2007 | Niazi et al. | |
| 2009/0152216 A1 | 6/2009 | Champion et al. | |
| 2011/0078346 A1 | 3/2011 | O'Connor et al. | |
| 2012/0014384 A1 | 1/2012 | Diab et al. | |
| 2015/0317594 A1* | 11/2015 | Reznik | G06Q 10/063114 |
| | | | 705/7.15 |
| 2017/0086332 A1* | 3/2017 | Jaskela | H05K 7/20718 |

\* cited by examiner

MODULAR INFRASTRUCTURE MANAGEMENT DEVICE

CROSS-REFERENCE TO RELATED APPLICATIONS

This application is a continuation-in-part of prior application Ser. No. 15/872,952, filed Jan. 16, 2018, which is a continuation of prior application Ser. No. 15/862,582, filed on Jan. 4, 2018, which is a continuation of prior application Ser. No. 15/372,134, filed Dec. 7, 2016, which is a continuation of prior application Ser. No. 15/063,838, filed Mar. 8, 2016, which claims the benefit of U.S. Provisional Application No. 62/130,491, filed Mar. 9, 2015, entitled "High Serial Port Count Infrastructure Management Device," and U.S. Provisional Application No. 62/144,870, filed Apr. 8, 2015, entitled "High Serial Port Count Infrastructure Management Device," which are all hereby incorporated by reference in their entirety.

BACKGROUND

In data centers, the concentration of Information Technology ("IT") devices (e.g. virtual devices instantiated in combination with physical computing hardware and software such as: compute nodes, networking nodes, storage nodes, power nodes, and/or cooling nodes) may create a data center environment with significant overhead in tracking, configuring, clustering and managing IT device state(s). The IT devices may also have a multitude of interfaces, which may require a multitude of different IT device concentrator hardware units to physically connect to the IT devices. In some other data center environments, collocation environment or edge of the network point-of-presence may deploy a flexible number of same kind of IT devices or a flexible number of different kinds of IT devices, which may create a challenge on planning the right multitude of different IT device concentrator hardware units to physically connect to the IT devices. Some of the various techniques to work in such a cluttered environment may require a combination of device search tools, multiple IT device concentrator hardware units, management tools and/or many more additional supporting tools.

Additionally, various IT devices, such as IT devices by various vendors, may have different communication interfaces, network protocols, functions, user interfaces and application programmable interfaces (APIs), which may increase the difficulty of communicating with IT device(s). Deploying multiple devices, setting up consistent configurations and adding network functions on new or existing infrastructures is very time consuming and tedious. Networking teams typically spend a long time during evaluation, especially when numerous appliances are required.

DETAILED DESCRIPTION

Figure 1:
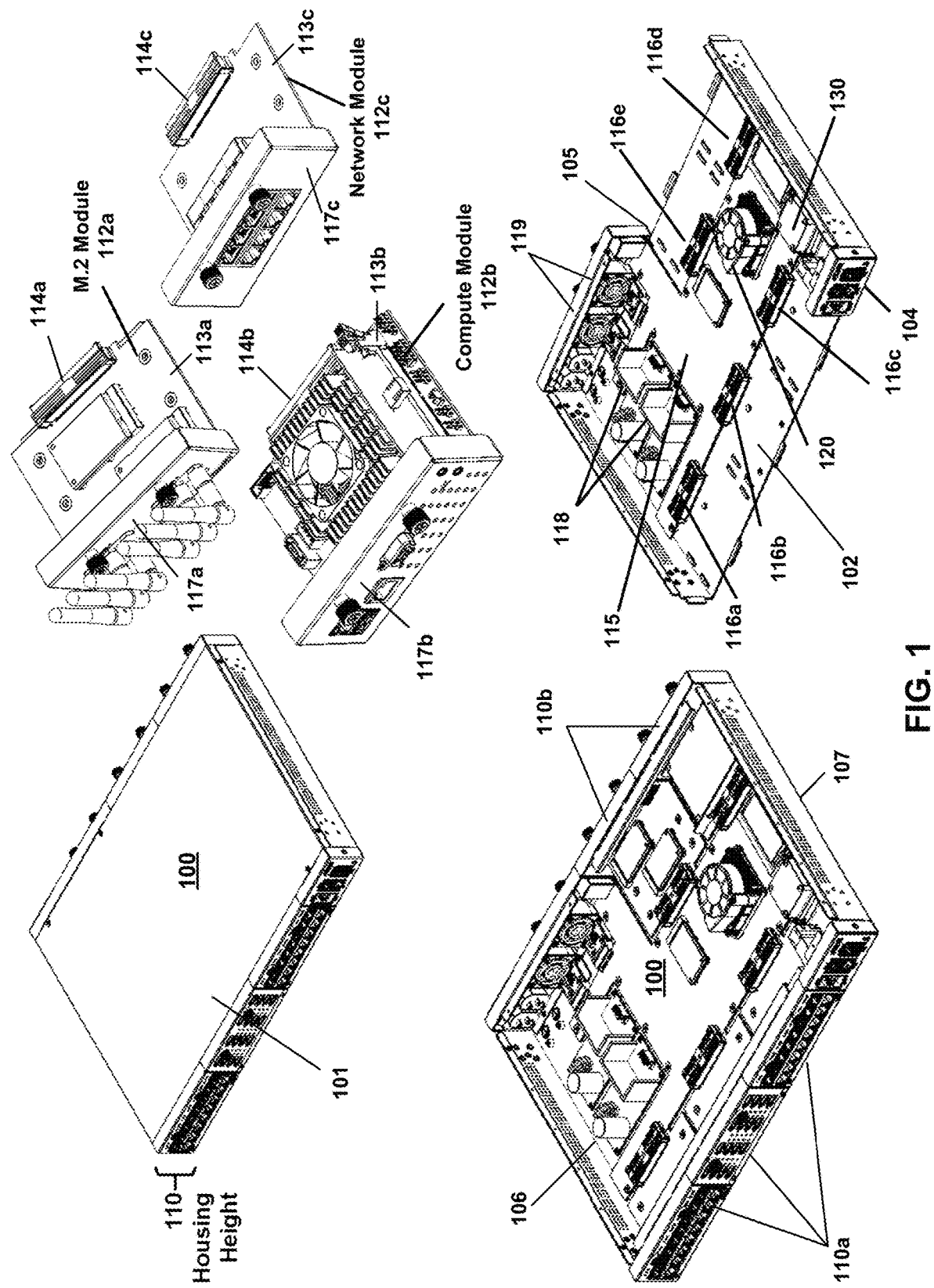
FIG. 1 illustrates various views of an exemplary modular infrastructure management device.

Some of the various embodiments of the present invention relate to infrastructure management systems, and more particularly to a data center infrastructure management device(s) configured to process network communication of data center component(s). Various embodiments relate to a data center infrastructure configured to process network communication from data center component(s) (e.g. IT devices) and employ the device information to determine an action to be performed on data center component(s) in an infrastructure management system.

A device is a machine and/or component that may attach to a computer and/or computer network. Examples of devices include disk drives, printers, displays, mice, and modems. These particular devices may fall into a category of peripheral devices separate from a main computing device. Other example devices may be non-peripheral devices such as IT devices. Many devices, whether peripheral or not, may employ a program called a device driver that may act as a translator, converting general commands from an application into specific commands that the device understands.

An IT device is an "Information Technology" device related to computing technology, comprising, but not limited to: data center devices, networking devices, hardware devices, software operating in combination with a hardware IT device, Internet devices, and/or the like. Some IT devices may employ virtual devices operating on specially configured hardware. Additional examples of IT devices include servers, compute nodes, routers, switches, firewalls, load balancers, networking nodes, storage nodes, power nodes, cooling nodes, storage appliances, power appliances, cooling appliances, network appliances, virtual appliances, virtual machines, system hardware with network access, hosted module within a system, combinations thereof, and/or the like.

A virtual device may employ a software virtual device driver operating on a hardware computing device configured to emulate hardware and/or other devices so that multiple applications may, for example, access hardware interrupt channels, hardware resources and memory without causing conflicts. Computer hardware may require communication and control processes for devices and/or hardware components to access each other in a controlled manner. These processes may be defined as device drivers, which may comprise code that an application may employ to access hardware and/or external software resources. Some example virtual devices may be configured for use in multitasking operating systems. In such an example, a device driver may be controlled by an operating system's virtual device driver manager and shared by applications running within that kernel. A virtual device driver may pass interrupt and memory requests through the kernel, which in turn may allocate resources as required.

An agent may comprise a computer program that acts for a user or other program in a relationship of agency, which derives from the Latin agere (to do): an agreement to act on one's behalf. Such "action on behalf" of implies the authority to decide which, if any, action is appropriate. Some agents may comprise, but are not limited to: intelligent agents (in particular exhibiting some aspect of artificial intelligence, such as learning and reasoning), autonomous agents (capable of modifying the way in which the agent achieves objectives), distributed agents (being executed on physically distinct computers), multi-agent systems (distributed agents that do not have the capabilities to achieve an objective alone and thus must communicate), mobile agents (agents that can relocate their execution onto different processors), and/or the like.

Some of the various embodiments may communicate with virtual (in combination with configured hardware) and/or physical IT devices such as compute nodes, networking nodes, storage nodes, power nodes, cooling nodes, other IT devices, combinations thereof, and/or the like. An infrastructure management system may automatically perform an action on IT device(s)—based at least in part, by an IT device information.

The nature of the interaction between infrastructure management system(s) and IT device(s) may be regulated by the type of device itself to dictate network protocols natively supported by the IT device(s). The type of IT device(s) may also be used to identify a class or type of action that may apply for IT device(s) available in a network.

FIG. 1 illustrates various views of an exemplary modular infrastructure management device. The height 110 of the housing for the infrastructure management device may be one Rack-Unit (1 U) while mounted horizontally to the rack, less than one Rack-Unit (<1 U) while mounted horizontally to the rack, or zero Rack-Unit (0 U) while mounted vertically to the rack. The housing 100 may be configured to enclose one or more communication card modules 112a-c and a circuit board 115 having one or more processors, one or more planes for data and control, one or more non-transitory tangible machine-readable media, other semiconductor chips and/or components mounted thereon.

The housing 100 includes a cover plate 101 and a base plate 102. The base plate may include first edge 104 and second edge 105 that are parallel to each other, as well as third edge 106 and fourth edge 107 that are parallel to each other. The third edge 106 and fourth edge 107 are parallel and perpendicular to the first edge 104 and second edge 105. First modular slots 110a are disposed along the first edge 104 and second modular slots 110b are disposed along second edge 105. The term "slot" is used herein to refer to a receptacle or void in the housing 100 for receiving a communication card module 112a-c. The modular slots 110a-b are interchangeable and may share a common width. As shown in FIG. 1, three modular slots 110a are disposed along the first edge 104 and two modular slots 110b are disposed along the second edge 105. It should be appreciated that other configurations, such as three or more modular slots disposed along each edge, are also possible. Alternatively, modular slots may be disposed along only one of either first or second edges of the housing. The modular slots 110a-b are configured to removably receive at least one communication card module 112a-c. It should be also appreciated that a single communication card module may take half, one, two or more modular slots depending on the width of the communication card module, which may be equivalent to half, one, two, three modular slots width. A cover plate of the size of one or more slots may be used to cover a modular slot when it is not in use.

A circuit board 115 is disposed on the base plate 102 of the housing 100. The circuit board 115 is electrically coupled to the communication card modules 112a-c via the connectors 116a-e. A connector 116a-e is provided for each modular slot 110a-b along an edge of the circuit board 115 for electrically contacting an edge contact 114a-c of a communication card module 112a-c. The circuit board 115 may hold other components, such as a central processing unit (CPU) 120, a network switch 130, a data plane and a network plane. Other components, such as an input/output (I/O) interface units, fan, additional peripheral controller(s) related to the I/O interface units, system memory and common peripherals, or other semiconductor chips, may also be mounted on the circuit board 115. For example, the circuit board 115 may further include one or more network interfaces, a console port, one or more USB ports, a graphical port, a data storage device and/or other components. The housing 100 may also include one or more power supplies 118, one or more fans 119, and/or one or more power plugs for alternating current (AC) or direct current (DC) feeds.

The connectors 116a-e may be advantageously mechanically and electrically designed to avoid short circuits or burning to the user errors (e.g., fitting into the wrong slots). Each connector 116a-e may provide a common interface for the communication card modules 112a-c. In some implementations, the pins in the same positions of the connectors 116a-e are assigned the same functions (or signals), regardless of whether the functions are used by the respective communication card module 112a-c or not. For example, the connectors 116a-e may be implemented as 120-pin connectors following the same pin position and signal assignments for different power voltage signals, ground signals, data signals for a data bus or data plane, control signals for a control bus or control plane, regardless of whether they are electrically connected or not. Any pin that may not be in use by the communication card modules 112a-c may be electrically disconnected.

A communication card module 112a-c may be removably inserted into any half, one or more (e.g., 1.5, 2, 3 or more) modular slots 110a-b. Each communication card module 112a-c includes a circuit board 113a-c having one or more semiconductor chips. The circuit board 113a-c has first and second parallel edges, and third and fourth parallel edges perpendicular to the first and second edges. A face plate 117a-c is disposed along the first edge and perpendicular to the circuit board 113a-c, and an edge contact 114a-c is disposed along the second edge. The face plate 117a-c may be aligned along the first edge 104 of the housing 100 when the communication card module 112a-c is removably inserted into one or more first modular slots 110a. The face plate 117a-c may be aligned along the second edge 105 of the housing 100 when the communication card module 112a-c is removably inserted into one or more second modular slots 110b. The communication card modules 112a-c may be removably inserted into the modular slots 110a-b to provide the desired functionalities to the infrastructure management device.

When the communication card module 112a-c is removably inserted into one or more first modular slots 110a, the face plate 117a-c is aligned along and flush against (or directly adjacent to) the first edge 104 of the housing 100 and the edge contact 114a-c electrically contacts the corresponding connector 116a-c on the circuit board 115. When the communication card module 112a-c is removably inserted into one or more second modular slots 110b, the face plate 117a-c is aligned along and flush against (or directly adjacent to) the second edge 105 of the housing 100 and the edge contact 114a-c electrically contacts the corresponding connector 116d-e on the circuit board 115. The face plate 117a-c may include, for example, one or more communication interfaces for providing one or more connections between the infrastructure management device and one or more external devices. The one or more communication interfaces may include at least one of the following: one or more null-modem serial ports; one or more Data Communications Equipment (DCE) serial ports; one or more Data Terminal Equipment (DTE) serial ports; one or more Cisco pinout serial ports; one or more Cyclades pinout serial ports; one or more straight-through serial ports; one or more cross-over serial ports; one or more RJ45 ports; one or more RS-232 serial ports; one or more RS-485 serial ports; one or more universal serial bus (USB) ports; one or more serial ports; one or more Local Area Network (LAN) ports; one or more Wide Area Network (WAN) ports; one or more Wi-Fi wireless Network ports; one or more input-output (I/O) ports, one or more Ethernet ports (e.g., gigabit Ethernet or GbE ports, copper, Power over Ethernet or PoE+, small form factor pluggable or SFP+, etc.), cellular, a combination of the above and/or the like.

In some implementations, the width ($w_1$) of the face plate 117a-c of each communication card module 112a-c is a multiple (n) of the width ($w_2$) of a modular slot 110a-b (i.e. $w_1=nw_2$, where n is an integer). For example, a power modular card with nine power outlets may occupy two modular slots. It may be advantageously more cost effective to make one card instead of two individual cards to provide the same number of power outlets to fit into two modular slots. In another example, it may be advantageously more cost effective to make a single communication card that occupies three modular slots in order to house 48 RJ45 serial ports on one single circuit board, instead of three communication cards of 16 RJ45 serial ports each. Additionally, by providing communication card modules that are removably insertable into the infrastructure management device, the infrastructure is advantageously dynamically scalable to the needs and requirements of the network system.

Each of the communication card modules 112a-c may provide one or more desired functionalities to the infrastructure management device. The desired functionalities may include, but are not limited to, one or more communication interfaces, network adapter (e.g., Local Area Network or LAN, Wide Area Network or WAN, Virtual Private Network or VPN, Wi-Fi, wireless WAN, Bluetooth™), storage (e.g., solid-state drive, dynamic random access memory, static random access memory, hard drive), cellular connectivity, satellite navigation, near field communication (NFC), digital radio, Wireless Gigabit Alliance (WiGig), power, compute functions, outlet functions, keyboard-video-mouse (KVM) switch, or a combination thereof.

The communication card modules 112a-c may include the necessary logic for functioning according to a respective standard specification, such as the M.2 (or Next Generation Form Factor), mSATA, Personal Computer Memory Card International Association (PCMCIA), and so forth. Although an M.2 module 112a, a compute module 112b and an 8-port gigabit Ethernet (GbE) network module 114c are shown in FIG. 1, it should be appreciated that other types of communication card modules may also be provided, as for example, demonstrated on FIG. 2.

The modular infrastructure management device and removable communication card modules 112a-c allows the user to select the desired functionality by removably inserting respective communication card modules 112a-c in each of the modular slots 110a-b. If the user desires a different functionality, the user may simply remove a communication card modules 112a-c from a modular slot 110a-b in the modular infrastructure management device and insert a different communication card modules 112a-c. It should be appreciated that an Operating System (OS) may automatically identify the type of communication card module that is attached and may provide options to configure the different communication card modules.

Figure 2:
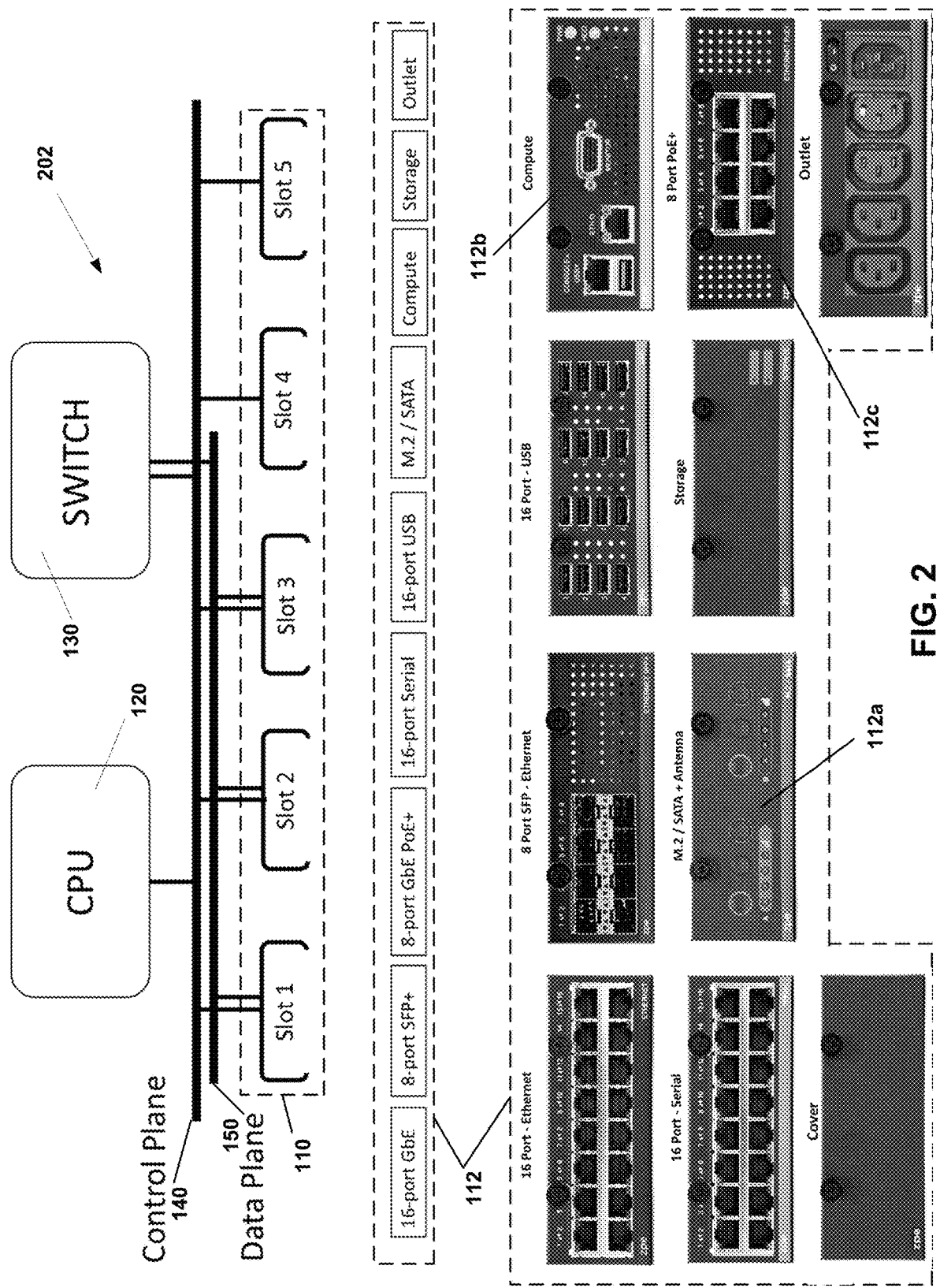
FIG. 2 shows exemplary services architecture of the modular infrastructure management device.

FIG. 2 shows exemplary services architecture 202 of the modular infrastructure management device. As shown, various types of communication card modules 112 may be removably inserted into the five modular slots 110 to provide additional functionalities. Communication card modules 112 include, but are not limited to, 16-port GbE module, 8-port GbE module, 16-port serial module, compute module, M.2/SATA module, M.2/SATA+Antenna module, 16-port USB module, storage module, 8-port SFP+ module, 8-port GbE PoE+ module, cover module, power module and outlet module. It should be appreciated that other types of communication card modules may also be provided, including but not limited to, a 32-port serial module, a 48-port serial module, a 32-port network module and a 48-port network module.

In some implementations, the CPU 120 provides a control plane 140 that extends over at least some or all of the modular slots 110. The control plane 140 is a component of the services architecture 202 that may be concerned with the interface configuration settings and overall policies for a communication card. It should be appreciated that the CPU 120 may also provide a management interface for the infrastructure management device. In some implementations, the CPU 120 may also provide networking processing and data routing capability for network data traffic. It should also be appreciated that the CPU 120 may run control and/or data planes directly on the host Operating System (OS) or on one or more virtual machines, one or more Network Function Virtualization (NFV), one or more Virtual Network Functions (VNF) or one or more docker applications. The network switch 130 may provide a data (or forwarding) plane that extends over at least some of the slots 110 (e.g., slots 1 through 3). It should be appreciated that the network switch 130 may provide a data plane for all available slots on the services archicteture 202. The data plane 150 defines the part of the services architecture 202 that may decide what to do with packets arriving on an inbound interface. It should be appreciated that the network switch 130 may route and handle incoming or outgoing packets via the data plane 150 without disrupting the CPU 120. It should be also appreciated that the CPU 120 may configure and control one or more communication cards and the network switch 130 via the control plane 140 without disrupting the network switch 130 or the communication on the data plane 150. It should also be appreciated that the presence of both data plane 150 and control plane 140 may provide a non-blocking data and control flow to all modular slots 110, the CPU 120 and the network switch 130.

Figure 3:
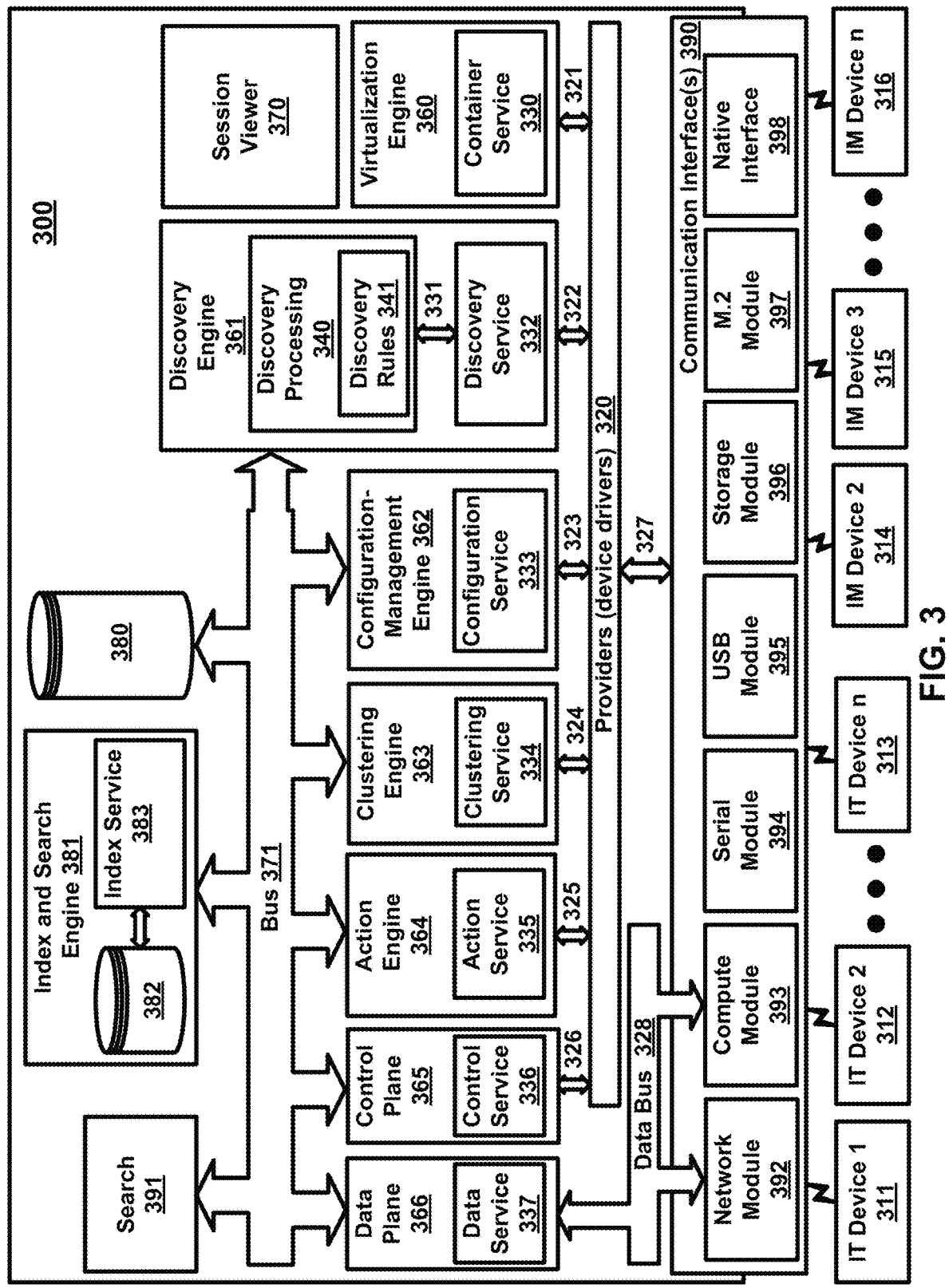
FIG. 3 is a block diagram of an exemplary modular infrastructure management device.

FIG. 3 is a block diagram of an exemplary modular infrastructure management device 300. Various components are involved in device communication over communications interface(s) where the modular infrastructure management device 300 may configure, discover, cluster, index, exchange index table, search and/or take action on at least one IT device in, for example, a data center, remote office, collocation, or edge of the network point-of-presence. The modular infrastructure management device 300 may interact with IT devices 311, 312, . . . , 313 and/or with other IM (Infrastructure Management) devices 314, 315, . . . , 316 via communication interface(s) 390 provided by one or more communication card modules 392, 393, . . . , 398 that are removably inserted into modular slots of the infrastructure management device 300.

The infrastructure management devices 300, 314, 315, . . . , 316 may comprise a housing, modular slots, and at least one of the following: system hardware with network access, a server, a compute node, a router, a switch, a firewall, a load balancer, a networking node, a storage node, a power node, a network appliance, a virtual appliance, a hosted module within a system, a combination thereof, and/or the like. The IT devices 311, 312, . . . , 313 may comprise, for example, a server, a compute node, a router, a switch, a firewall, a load balancer, a networking node, a storage node, a power node, a cooling node, a storage appliance, a power appliance, a cooling appliance, a network appliance, a virtual appliance, a virtual machine, system hardware with network access, a hosted module within a system, a combination thereof, and/or the like.

Providers 320 may comprise modules configured to understand the communication protocols capabilities of IT devices 311, 312, . . . , 313 and/or IM devices 314, 315, . . . , 316 and may employ these capabilities to interact with such devices via interface 327 and one or more communication interface(s) 390 provided by communication card modules 392, 393, . . . , 398. The providers 320 may also interact with virtualization engine 360, discovery engine 361, configuration/management engine 362, clustering engine 363 action engine 364 and/or control plane 365 of the infrastructure management device 300. Providers 320, engine modules 360, 361, 362, 363, 364 and/or control plane 365 may interact via provider interface(s) 321, 322, 323, 324, 325, and/or 326 respectively.

Configuration/management engine 362 may provide an interface to configure and/or manage infrastructure management device 300 via configuration service 333. The interface may comprise a user interface which may be available via, for example, a command line interface (CLI), a web interface, programmatically via an application programmable interface (API), a combination thereof, and/or the like. The configuration may comprise at least one of the following: IT device information, discovery enablement information, clustering enablement information, a combination thereof, and/ or the like. The IT device information may comprise at least one of the following: a universally unique identifier, a virtual machine name, a hypervisor IP address, an alias IP address, a group/community identifier, a port identifier, a port range identifier, a serial port range, a serial port identifier, a serial port name, an IT device name, a power status, an action, a list of actions, a command, a hostname, an icon, an Internet Protocol (IP) address, a protocol type, a service processor type, a media access control (MAC) address, a hierarchical organization, a connection status, a configuration parameter, a user defined field and value, a map address location, a group IT device parameters, a group of users' parameters, an IT device access rights parameter, a notification parameter, a data logging parameter, an alert parameters, an IT device initial status, a combination thereof, and/or the like. The discovery enablement information may comprise at least one of the following: a configuration parameter, a multitude of parameters, an action, a multitude of actions, and an IT device state. The clustering enablement information device may comprise at least one of the following: a configuration parameter, a multitude of parameters, an action, a multitude of actions, an IT device state, a combination thereof, and/or the like. The configuration-management engine 362 may be connected, for example, via bus 371 to a non-volatile memory 380 in order to store, read or update the configuration information required by the system. The non-volatile memory 380 may include at least one of the following: an in-memory data store, an on-disk data store, a local data store, a remote data store, a distributed data store, a replicated data store, a combination of the above, a combination thereof, and/or the like.

Continuing on example FIG. 3 and according to some of the various implementations, discovery engine 361 may be employed for discovering of IT devices which may be interconnected via communication interface(s) 390. IT devices 311, 312, . . . , 313 may request connection and/or configuration via communication interface 390 once they are powered on and/or from time to time (e.g. a periodic basis). The identification of the IT devices 311, 312, . . . , 313 may be collected by the discovery service 332. Alternatively, discovery service 332 may also discover the IT device identification by polling for information from time to time (e.g., on a periodic basis). In this example scenario, polled IT device(s) may also comprise a concentrator of additional child IT device(s) and the information collected from the polled IT device(s) may contain a collection of IT device information identification from the children IT device(s). This mechanism may provide a bulk discovery process. For example (but not limited to), console server IT devices from multiple vendors may provide information on IT device(s) connected via their serial ports. Similarly, a virtual machine hypervisor may provide information on virtual machines running on that system. Examples of IT device identification may comprise, but are not limited to: universally unique identifier (UUID), VM name, group/community information, IP address, media access control address (MAC address), hostname, serial port range, combinations thereof, and/or the like. IT device identification may be sent via 331 to discovery processing 340 and may be evaluated by discovery processing 340 against discovery rules 341 in the system.

Discovery rules 341 may employ a combination of logic of parameters, such as, for example, AND/OR logic. Matching criteria may be based on partial parameters and/or full parameters inspected against the IT device identification. A discovery action, (such as, but not limited to an update of existing IT device, add new IT device, a combination thereof, and/or the like) may be taken in combination with, for example, upon a successful match between one or more of the discovery rules 341 and IT device identification. Examples of discovery actions sent via bus 371 to a non-volatile memory 380 may comprise, but are not limited to: clone configuration from an existing device, update configuration if an IT device already exists and if changes are required, deny clone, (which means no response may be given to the IT device from the system—this allows supporting multiple discovery systems in the same network), a combination thereof, and/or the like. A discovery action may also get information from a non-volatile memory 380 via bus 371 in order to perform a discovery service 332. Additionally, non-volatile memory 380 may hold, for example, IT device data for a newly added IT device, changes or updates on existing IT device(s), information on existing IT device(s) that may be used on cloning process or discovery process, combinations thereof, and/or the like.

Continuing on FIG. 3 and according to some of the various implementations, index and search engine 381 may employ index service 383 to index IT device information that may be retrieved from non-volatile memory 380 via bus 371 and store the indexing into non-volatile IT device index 382. Index service 383 indexing may comprise: collecting at least one IT device information for at least one of at least one IT device from the infrastructure management device, processing at least one IT device information for at least one of at least one IT device from the infrastructure management device, organizing at least one IT device information for at least one of at least one IT device from the infrastructure management device, updating the IT device index of the infrastructure management device, a combination thereof, and/or the like. The IT device index 382 may comprise at least one of the following: an in-memory data store, an on-disk data store, a local data store, a remote data store, a distributed data store, a replicated data store, a combination of the above, and/or the like.

Continuing on FIG. 3 and according to some of the various implementations, clustering engine 363 may employ clustering service 334 to cluster the infrastructure management device 300 with at least one other infrastructure management device 314, 315, . . . , 316 when enabled by the clustering enablement information. The clustering service 334 may comprise (but not limited), at least one of the following: configuring one of the clustered infrastructure management devices to name and maintain a list of a multitude of infrastructure manager devices communicatively connected, configuring one of the clustered infrastructure management devices to define at least one credential for a multitude of infrastructure manager devices communicatively connected on at least one named list, configuring one of the clustered infrastructure management devices to define at least one SSL (Secure Socket Layer) certificate for the clustered infrastructure management devices communicatively connected on at least one named list, configuring one of the clustered infrastructure management devices to request a list of the clustered infrastructure management devices communicatively connected on at least one named list, configuring one of the clustered infrastructure management devices to interact to at least one of the clustered infrastructure management devices communicatively connected on at least one named list, providing at least one IT device information of the clustered infrastructure management devices communicatively connected on at least one named list, exchanging at least one IT device index 382 of the clustered infrastructure management devices communicatively connected on at least one named list, a combination thereof, and/or the like Continuing on FIG. 3 and according to some of the various implementations, search module 391 may search IT device index 382 information via bus 371 for a list of IT device information based on criteria applied to IT device index. The searching may further comprise conducting a natural language search with at least one of the following: a tabular representation of the search result, a Web representation of the search results, an organizational tree representation of the search results, a graphical node representation of the search results, a geographic map representation of the search results, a command-line interface (CLI) representation of the search results, a combination thereof, and/or the like. The criteria may comprise at least one of the following: a query parameter, a source document index, a source field, a number of matching results to return, a sorting order, a Boolean logic, a filter, a range, a logical condition, an aggregation, a relevance, a combination of the above, and/or the like.

Continuing on FIG. 3 and according to some of the various implementations, the action engine 364 may employ the action service 335 to perform at least one the following: executing at least one user defined command on at least one of the at least one IT device over at least one of the at least one communications interface, executing at least one user defined script on at least one of the at least one IT device over at least one of the at least one communications interface, executing at least one user defined program on at least one of the at least one IT device over at least one of the at least one communications interface, executing at least one user defined command on at least one of the at least one IT device locally, executing at least one user defined script on at least one of the at least one IT device locally, executing at least one user defined program on at least one of the at least one IT device locally, executing at least one user defined command on at least one of the at least one other infrastructure management device over the network, executing at least one user defined script on at least one of the at least one other infrastructure management device over the network, executing at least one user defined program on at least one of the at least one other infrastructure management device over the network, executing at least one user defined command on the infrastructure management device locally, executing at least one user-defined script on the infrastructure management device locally, executing at least one user defined program on the at least one infrastructure management device locally, performing a serial console connection over at least one of the at least one communications interface, performing a serial virtual machine console connection over at least one of the at least one communications interface, performing a SOL (Serial-Over-Lan) console connection over at least one of the at least one communications interface, performing a KVM (Keyboard-Video-Mouse) console connection over at least one of the at least one communications interface, performing a MKS (Mouse-Keyboard-Screen) virtual machine console connection over at least one of the at least one communications interface, performing a power command on at least one of the at least one IT device over at least one of the at least one communications interface, establishing a TCI/IP tunnel between the user's workstation and the infrastructure management device, performing access rights control on commands, performing data log collection on an IT device data session, performing alert and notification based on configuration and data log collection from at least one of the at least one IT device, performing authentication and authorization to a user based on at least on one of the following: command, user group and IT device, a combination thereof, and/or the like.

With respect to an action performed by action service 335, for example, a pre-defined command like "power off" may be executed as part of a set of actions taken by a system administrator accessing an infrastructure management device in response to an IT device search result based on a search criteria applied across the IT device index 382. Since the IT device index 382 from single clustered infrastructure management device(s) may have been previously exchanged by the clustering service 334, the search may be performed over a local copy of the IT device index 382 and cover multiple clustered infrastructure management devices. Providers 320 and communication interface(s) 390 may provide a means to communicate with the IT device in order to carry out the execution of the command "power off" on the IT device regardless of the IT device type enrolled in the infrastructure management device. In another example, the IT device may report a firmware version state like "firmware version 1.2," which may require a complex set of actions performed by a user defined command such as "firmware upgrade" implemented via a custom script residing on one or more of the IT device(s) in the network. The custom script may make use of abstraction provided by provider(s) 320 and communication interface(s) 390 in order to carry out multiple actions such as, for example, upgrading firmware on the IT device follow by a "power reboot."

Continuing on FIG. 3 and according to some of the various implementations, the virtualization engine 360 may employ container service 330 which may host, configure and managed virtualized process(es) and environment(s) on the infrastructure management device. Example of virtualized process(es) and environment(s) may comprise, but are not limited to: dockerized applications, docker hypervisor, docker containers, virtual machine hypervisors, kernel-based virtual machines, virtual applications, virtual machines, virtual appliances, storage hypervisors, platform virtualization software, data mining applications, data collector applications, dash board applications, report applications, network function virtualization (NFV), virtual network functions (VNF), combinations thereof, and/or the like. For example, a standard dockerized splunk application could be hosted, configured, managed and executed by virtualized engine 360 and may crunch data available on the infrastructure management device in order to provide visualization of information.

Also illustrated on FIG. 3 and according to some of the various implementations, session viewer 370 may provide a proxy viewer (e.g., an HTML5 proxy viewer) of the native user interface of at least one of the IT devices 311, 312, . . . , 313 connected to infrastructure management device 300. This process may provide a means to interact with an IT device UI (User Interface), without requiring additional application(s) be installed at end user workstation(s) and/or without requiring direct communication between an end user's workstation and an IT device. For example, an HTML5 proxy for a native user interface may include: a console viewer, remote console viewer, a remote SSH (Secure Shell) viewer, a TELNET view, a KVM (Keyboard-Video-Mouse) viewer, a virtual KVM (Keyboard-Video-Mouse) viewer, an MKS (Mouse-Keyboard-Screen) viewer, a virtual MKS (Mouse-Keyboard-Screen) viewer, a RDP (Remote-Desktop-Protocol) viewer, an VNC (Virtual-Network-Computing) viewer, a WEB viewer, combinations thereof, and/or the like. According to an additional example, a user accessing the infrastructure management device 300 may launch an MKS viewer to an IT device that actually is a virtual machine running on a VMware EXSi server, without requiring direct network access to the virtual machine itself. When the MKS viewer is requested by the user, the infrastructure management device 300 may start an authorized and authenticated session with the virtual machine using a VMware application installed directly on the infrastructure management device 300 and the MKS viewer may forward the mouse, keyboard and screen interactions to an HTML 5 javascript running on a user's workstation browser. In this example, no application may be installed on the user's workstation and the HTML 5 javascript may be rendered directly from the infrastructure management device to the user's browser offering the same user experience on different browser applications, workstations, mobile devices, combinations thereof, and/or the like.

Continuing on FIG. 3 and according to some of the various implementations, control plane 365 may employ the control service 336 to perform at least one of the following: configuring interface settings and/or overall policies on the communication modules 392, 393, 394, 395, 396, 397, 398 of communication interface(s) 390, maintaining a routing table that defines what to do with incoming packets from IT devices 311, 312, . . . , 313 and/or IM devices 314, 315, . . . , 316, participating in routing protocols, defining certain packets to be discarded, providing preferential treatment of certain packets, populating a forwarding information base for looking up packets, and so forth. The control plane 365 may also perform communication data processing and data routing capability for the communication modules, which may performed directly by control service 336, or via providers 320 on the virtualization engine 360 employing one or more virtual machines, one or more Network Function Virtualization (NFV), one or more Virtual Network Functions (VNF) or one or more docker applications hosted on container service 330.

Continuing on FIG. 3 and according to some of the various implementations, data plane 366 may interact with one or more communication card modules, such as network module 392 and compute module 393, via a data bus 328. Data plane 366 may employ the data service 337 to look up a table (e.g., routing table or forwarding information base) to decide what to do with packets arriving on an inbound interface. Data plane 366 may also employ data service 337 to send and receive data via data bus 328 between one or more network modules 392, one or more compute modules 393 or a combination thereof. Data plane 366 may also employ data service 337 via data bus 328 to communicate data from and to the network module 392, compute module 393 or a combination thereof, via the bus 371 to the control plane 365 and control service 336, or to the virtualization engine 360 via provider 320.

Continuing on FIG. 3 and according to some of the various implementations, communication card modules may include, but are not limited to, network module 392, compute module 393, serial module 394, USB module 395, storage module 396, M.2 module 397 and native interface 398. Such communication card modules 392, 393, . . . , 397 may be removably inserted into modular slots of the infrastructure management device 300, as previously described with reference to FIGS. 1 and 2. Such communication card modules 392, 393, . . . , 398 may provide communication interface(s) 390 and/or logic to perform additional functionalities to interface with IT devices 311, 312, . . . , 313 and/or IM devices 314, 315, . . . , 316.

Figure 4:
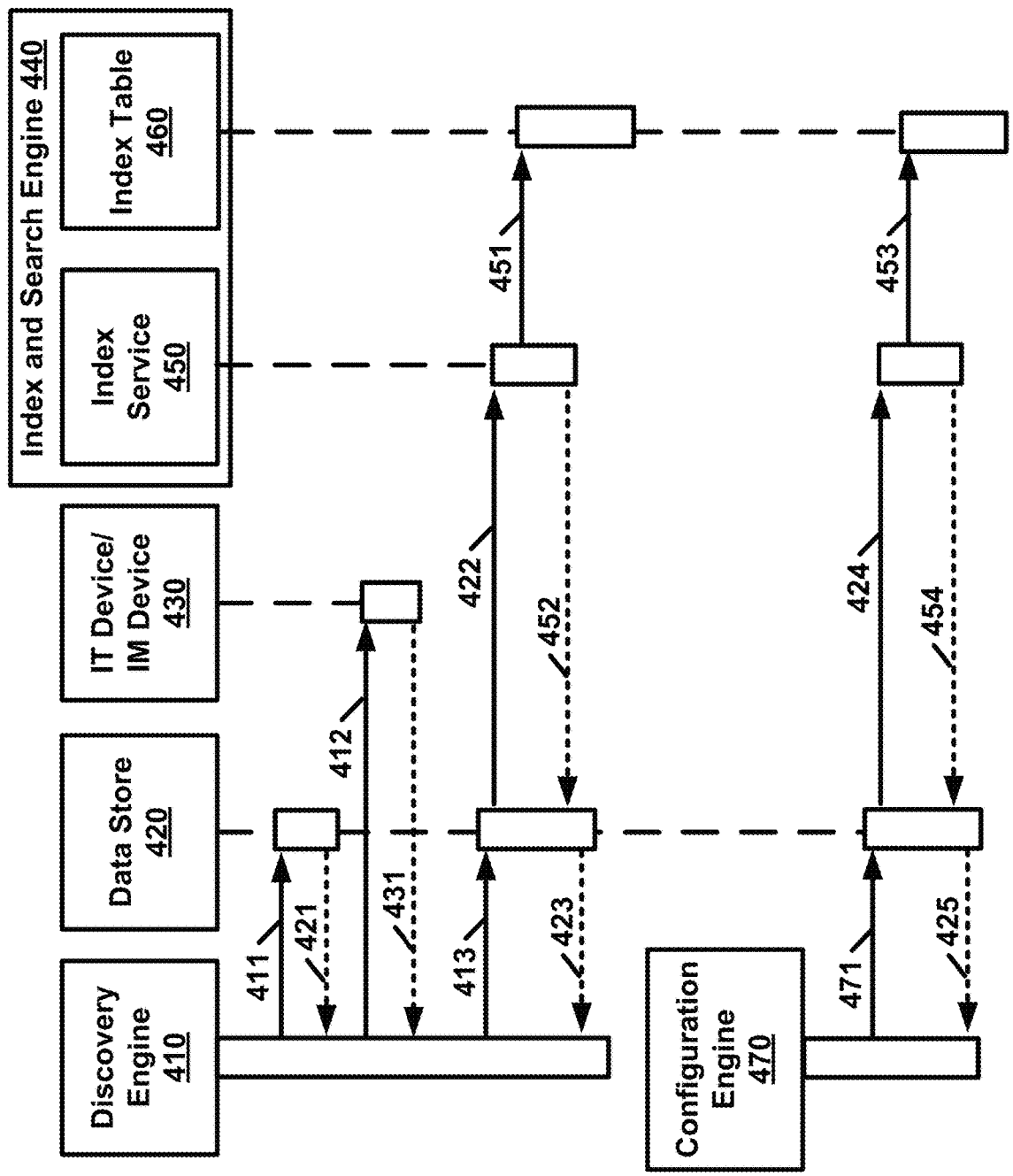
FIG. 4 is a flow diagram illustrating an exemplary technique for the discovering and/or configuring an IT device communicating with the modular infrastructure management device.

FIG. 4 is a flow diagram illustrating an exemplary technique for the discovering and/or configuring an IT device communicating with the modular infrastructure management device. The discovery engine 410 may request, via 411, configuration information from a non-volatile data store 420. A typical response may include information about the discovery rules and discovery service, which may be provided by the data store 420 to the discovery engine 410 via 421. Discovery engine 410 may employ this information to initiate an interaction with IT device/IM device 430 via 412. Discovery engine 410 may also wait for an interaction initiated by the IT device/IM device 430 via 431. Discovery engine 410 may discover a new IT device/IM device 430 and/or may discover a new information about an existing IT device/IM device 430. The new device and/or the information update may be sent to data store 420 via 413 and the data store may reply with a notification status via 423. The communication via 413 may be executed in bulk and/or batch. The information entered into data store 420 may trigger via 422, a call to index service 450 inside index and search engine 440, which may cause an update via 451 to the index table 460. Once the information has been processed by the index service 450, it may send a notification status via 452 to data store 420.

In another independent flow at FIG. 4, configuration engine 470 may send, via 471, configuration information to data store 420 and the data store 420 may reply with a notification status via 425. The communication via 471 may be executed in bulk and/or batch. The information entered into data store 420 may trigger, via 424, a call to index service 450 inside index and search engine 440, which may cause an update via 453 to the index table 460. Once information has been processed by the index service 450, the index service 450 may send a notification status via 454 to data store 420.

Figure 5:
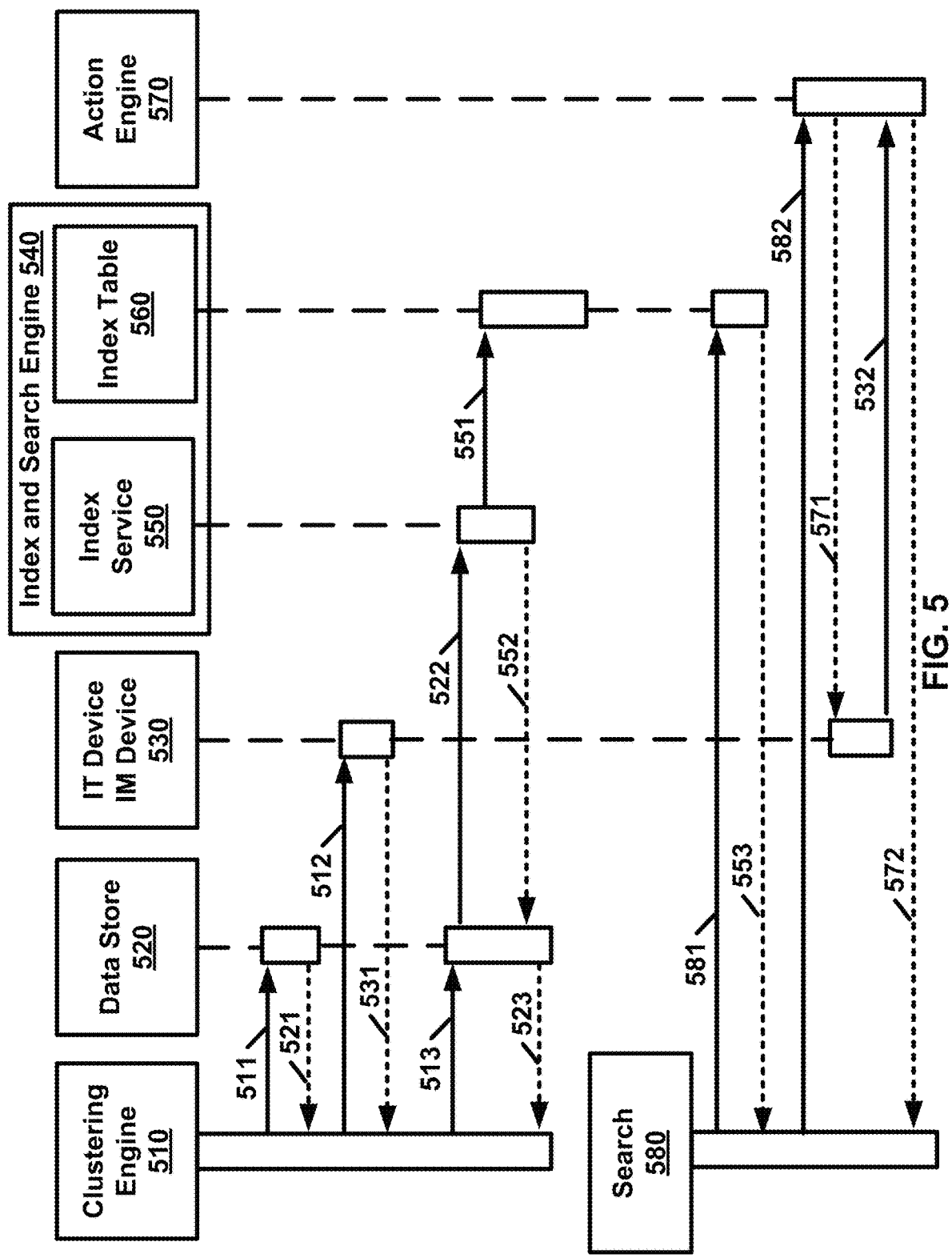
FIG. 5 is another flow diagram illustrating an exemplary technique for clustering and/or searching of an IT device communicating with the modular infrastructure management device.

FIG. 5 is another flow diagram illustrating an exemplary technique for clustering and/or searching of an IT device communicating with the modular infrastructure management device. Clustering engine 510 may request, via 511, configuration information from a non-volatile data store 520. A typical response may include information about this and other infrastructure management devices which may be configured to connect to the common secured cluster community via a communications interface. The configuration information may be provided by data store 520 to clustering engine 510 via 521. The clustering engine 510 may employ this information via 512 to initiate a new connection and/or keep a periodic interaction with at least one infrastructure management device at IT device/IM device 530. Response 531 may be employed to track the status and/or information of the clustering connection. This status/information of the clustering connection may be sent, via 513, to data store 520 and may be stored for future reference. The data store 520 may reply with a notification status via 523. The information entered into data store 520 may trigger, via 522, a call to index service 550 inside index and search engine 540, which may cause an update, via 551, to index table 560. Once information has been processed by index service 550, index service 550 may send a notification status, via 552, to data store 520. Alternatively, clustering engine 510 may share its local IT device index information, via 512, with other infrastructure management devices at IT device/IM device 530 that may be part of the clustering connection. Other infrastructure management devices may send their individual IT device index information, via 531, so that each infrastructure management device may have IT device index information of each other available locally.

In another independent flow at FIG. 5, search 580 may send search requests 581, which may use natural language search queries and/or other query formats and criteria, to index table 560 inside index and search engine 540. The search queries may be performed over locally available IT device index table 560. Search result 553 may be provided to search 580. Search 580 may employ the search result to request one or multiple actions 582 to action engine 570. The action commands 571 may be performed over IT devices/IM devices 530 and their action results 532 may be sent to action engine 570. The action engine 570 may also report action results 572 back to search 580.

Figure 6:
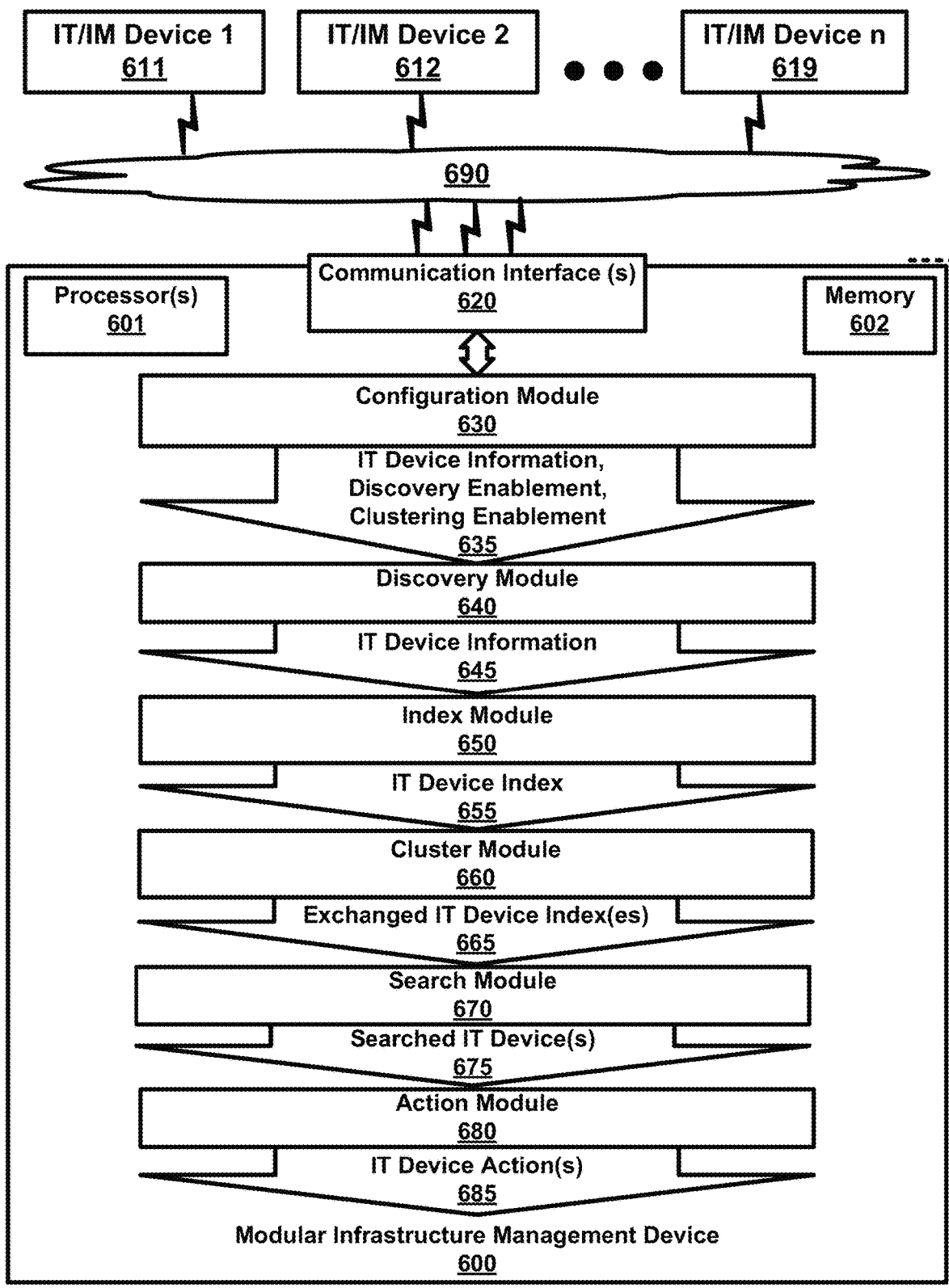
FIG. 6 is a block diagram of an exemplary modular infrastructure management device.

FIG. 6 is a block diagram of an exemplary modular infrastructure management device 600. The modular infrastructure management device 600 may include at least one processor 601, memory 602, communication interface(s) 620 and other supporting hardware (e.g. electronic communications busses, controllers, non-transitory tangible machine readable medium readers, combinations thereof, and/or the like). Memory 602 may comprise one or more non-transitory tangible machine-readable media. The one or more non-transitory tangible machine-readable media may include instructions configured to cause at least one processor 601 to perform a process of configuring, discovering when enabled by the discovery enablement information, indexing IT device information into an IT device index, clustering the infrastructure management device when enabled by the clustering enablement information, exchanging IT device index information with other infrastructure management devices being clustered, searching IT device index information for a list of IT device information based on criteria and performing an action on IT device(s), determined at least in part, by IT device information. The communication interface(s) 620 may be configured to communicate with a multitude of IT devices/IM devices (611, 612 . . . 619) over a network 690. The communications interface(s) 620 may comprise, but not limited to, at least one of the following: a serial port, an RS-232 serial port, an RS-485 serial port, a Local Area Network (LAN), a Wide Area Network (WAN), a Virtual Private Network (VPN), a Wi-Fi wireless Network, an USB port, Bluetooth™, cellular, a combination of the above, and/or the like.

The network 690 may comprise, but is not limited to: the Internet, an intranet, a connection to the Internet, a private cloud, interconnected data centers, a multi-nodal network, two or more computing devices connected using a Virtual Private Network (VPN), an on-premise network, an RS-232 serial network, an RS-485 serial network, a Local Area Network (LAN), a Wide Area Network (WAN), a Wi-Fi wireless network, an USB port, a Bluetooth™, cellular network, a combination thereof, and/or the like. The infrastructure management device 600 may comprise a multitude of infrastructure management devices 600 configured to cooperatively operate together. Examples of an infrastructure management device 600 may comprise, but are not limited to: a housing with at least five modular slots, one or more communication card modules removably inserted in the at least five modular slots, and at least one of the following: a system hardware with network access, a server, a compute node, a router, a switch, a firewall, a load balancer, a networking node, a storage node, a power node, a network appliance, a virtual appliance, a hosted module within a system, a combination thereof, and/or the like. According to some implementations, IT/IM device(s) (611, 612, . . . , 619) may comprise at least one of the following: a server, a compute node, a router, a switch, a firewall, a load balancer, a networking node, a storage node, a power node, a cooling node, a storage appliance, a power appliance, a cooling appliance, a network appliance, a virtual appliance, a virtual machine, system hardware with network access, a hosted module within a system, a combination thereof, and/or the like.

Figure 7:
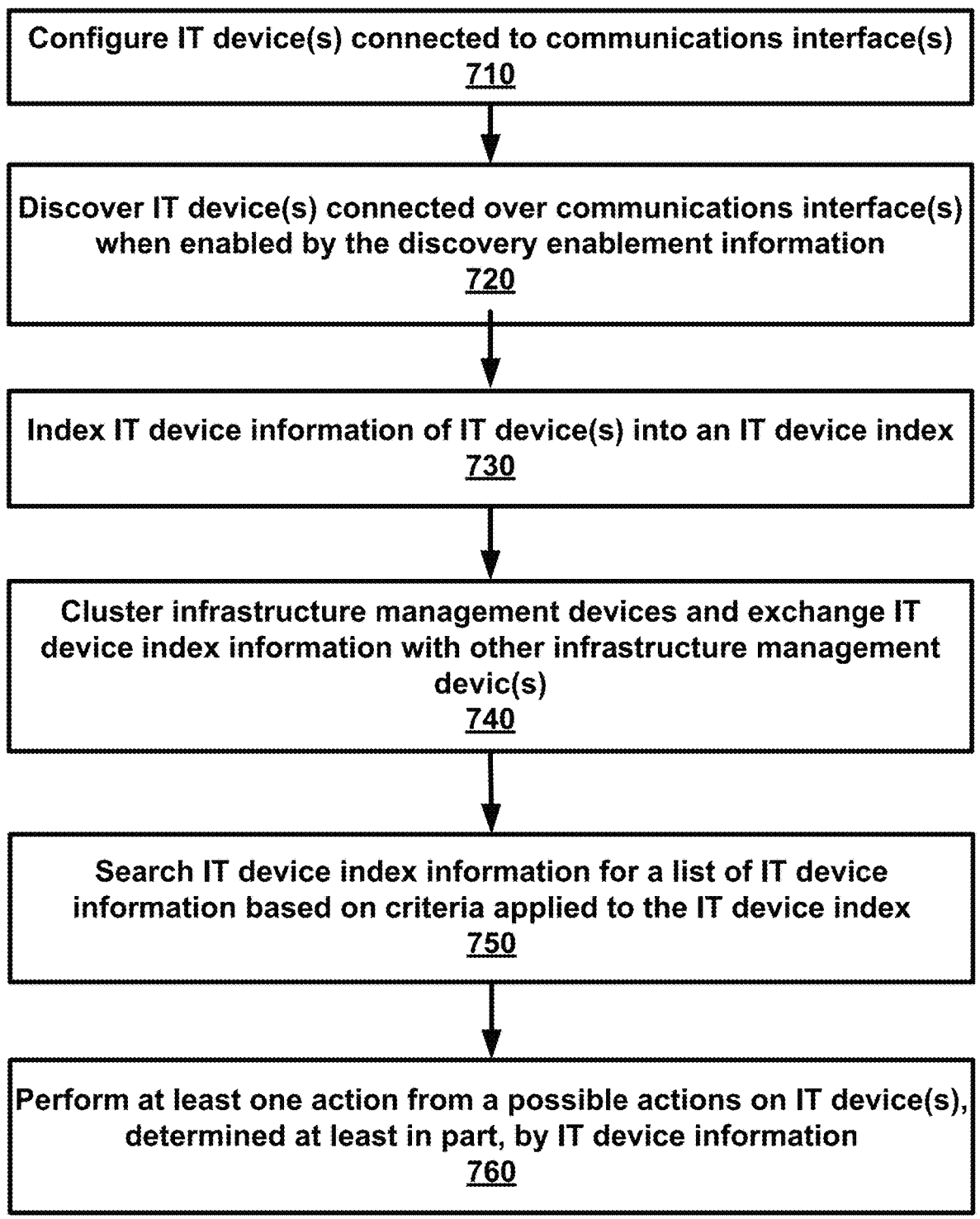
FIG. 7 is a flow diagram of an exemplary method of configuring, discovering, indexing, clustering, and/or taking action(s) implemented by a modular infrastructure management device.

FIG. 7 is a flow diagram of an exemplary method 700 of configuring, discovering, indexing, clustering, and/or taking action(s) implemented by a modular infrastructure management device. It should be understood that the steps of method 700 may be performed in the order shown or a different order. Additional, different, or fewer steps may also be provided. Further, the method 700 may be implemented with the modular infrastructure management device 600 of FIG. 6, a different system, or a combination thereof.

IT/IM device(s) (611, 612 . . . 619) communicatively connected over communication interface(s) 620 may be configured at step 710. This configuration may be performed by, for example, a configuration module 630. The configuration may configure the IT device information, the discovery enablement, and clustering enablement 635. The configuration of IT device(s) information may be performed in numerous ways according to various implementations. For example, IT device information may be configured by making changes to a universally unique identifier, a virtual machine name, a hypervisor IP address, an alias IP address, a group or community identifier, a port identifier, a port range identifier, a serial port range, a serial port identifier, a serial port name, an IT device name, a power status, an action, a list of actions, a command, a hostname, an icon, an internet protocol address, a protocol type, a service processor type, a media access control address (MAC address), a hierarchical organization, a connection status, a configuration parameter, a user defined field and value, a map address location, a group IT device parameters, a group of users' parameters, an IT device access rights parameter, a notification parameter, a data logging parameter, an alert parameters, an IT device initial status, a combination of the above, and/or the like. In a second example, a discovery enablement information may be configured by making changes to a configuration parameter, a multitude of parameters, an action, a multitude of actions, an IT device state, a combination of the above, and/or the like. In a third example, a clustering enablement information may be configured by making changes to a configuration parameter, a multitude of parameters, an action, a multitude of actions, an IT device state, a combination of the above, and/or the like.

IT/IM device(s) (611, 612 . . . 619) communicatively connected over communication interface(s) 620 may be discovered at step 720 when enabled by the discovery enablement information. This discovery may be performed by, for example, a discovery module 640. Discovering may define classes of communication methods, protocols and process used to discover the IT device information 645 of IT devices connected over a communication interface. Discovering may also, according to some of the various embodiments, be employed to identify possible mechanisms to interact back with IT device(s). Discovering may comprise determining if another of the multitude of IT/IM device(s) (611, 612 . . . 619) operates using a similar protocol. A protocol may comprise a system of digital rules for the exchange of data within or between computers. The rules may define format(s) for exchanging messages where some messages are configured to elicit a response from a range of possible responses pre-determined for that particular situation. A protocol may define the syntax, semantics, and synchronization of communication. Some specified behaviors may be independent of how an interface is implemented. A protocol may be implemented as hardware, software, or both. Some of the various communications protocols may be implemented according to one or more technical standards from organizations such as, but not limited to, the International Organization for Standardization (ISO), the International Telecommunications Union (ITU), the Institute of Electrical and Electronics Engineers (IEEE), and the Internet Engineering Task Force (IETF).

Discovering may further comprise determining if another of the multitude of IT/IM device(s) (611, 612 . . . 619) operates using a similar communication profile. Yet other discovering may comprise determining if another of the multitude of IT devices are the same class of IT device. Additionally, for example, IT device information may be discovered by interacting with at least one IT device connected to the serial port interface, listening to a communication from the at least one IT device, listening to an Dynamic Host Configuration Protocol (DHCP) request from the at least one IT device, interacting with a communications processor associated with at least one IT device, interacting with a communications processor disposed within at least one IT device, interacting with a virtual machine hypervisor, interacting with a console server, interacting with a terminal server, interacting with an agent, interacting with a Configuration Management Database (CMDB) system, interacting with a data store system, interacting with another infrastructure management device, a combination of the above, and/or the like.

IT device information of IT devices may be indexed into an IT device index at step 730. This indexing may be performed by, for example, an index module 650. The indexing of IT device information may be performed in numerous ways according to various implementations. For example, indexing may be performed by collecting information for at least one IT device from the modular infrastructure management device, processing information for at least one IT device from the modular infrastructure management device, organizing information for at least one IT device from the modular infrastructure management device, updating the IT device index of the modular infrastructure management device, a combination of the above, and/or the like.

In a second example, indexing may be performed by collecting, processing and/or organizing information for at least one IT device from at least one other infrastructure management device, updating the IT device index of at least one other infrastructure management device, a combination of the above, and/or the like. The result of the indexing may be stored in the IT device index 655. The IT device index may be implemented in numerous ways. For example, an IT device index may be implemented by an in-memory data store, an on-disk data store, a local data store, a remote data store, a distributed data store, a replicated data store, a combination of the above, and/or the like.

Clustering infrastructure management devices and exchanging IT device index information with other infrastructure management devices(s) may be performed at step 740. This clustering may be performed by, for example, a cluster module 660. The clustering of infrastructure management devices may be performed in numerous ways according to various embodiments. For example, a clustering may be performed by configuring one of the clustered infrastructure management devices to name and maintain a list of communicatively connected infrastructure management devices, configuring one of the clustered infrastructure management devices to define at least one credential for a multitude of communicatively connected infrastructure management devices on at least one named list, configuring one of the clustered infrastructure management devices to define at least one SSL (Secure Socket Layer) certificate for the clustered communicatively connected infrastructure management devices on at least one named list, configuring one of the clustered infrastructure management devices to request a list of the clustered communicatively connected infrastructure management devices on at least one named list, configuring one of the clustered infrastructure management devices to interact with at least one of the clustered communicatively connected infrastructure management devices on at least one named list, providing at least one IT device information of the clustered communicatively connected infrastructure management devices on at least one named list, exchanging at least one IT device index of the clustered communicatively connected infrastructure management devices on at least one named list, a combination of the above, and/or the like. As a result of the clustering, the exchanged IT device index(es) 665 may be available on at least one communicatively connected infrastructure management device.

Searching IT device index information for a list of IT device information based on criteria applied to the IT device index may be performed at step 750. This searching may be performed by, for example, a search module 670. The searching of IT device index information may be performed in numerous ways. For example, searching may be performed by conducting a natural language search which may return searched IT device(s) 675 in a tabular representation of the search result, a Web representation of the search results, an organizational tree representation of the search results, a graphical node representation of the search results, a geographic map representation of the search results, a command-line (CLI) representation of the search results, a combination of the above, and/or the like. Additionally, criteria applied to the IT device index may be a query parameter, a source document index, a source field, a number of matching results to return, a sorting order, a Boolean logic, a filter, a range, a logical condition, an aggregation, a relevance, a combination of the above, and/or the like.

Performing at least one action from possible actions on IT device(s), determined at least in part, by IT device information may be performed at step 760. This action may be performed by, for example, an action module 680. An IT device action(s) 685 may be an operation executed based on the searched IT devices. The IT device action(s) may be performed in numerous ways. For example, an IT device action(s) may be performed by: executing at least one user-defined command on at least one IT device over at least one communications interface, executing at least one user-defined script on at least one IT device over at least one communications interface, executing at least one user-defined program on at least one IT device over at least one communications interface, executing at least one user-defined command on at least one IT device locally, executing at least one user-defined script on at least one IT device locally, executing at least one user-defined program on at least one IT device locally, executing at least one user-defined command on at least one other infrastructure management device over the network, executing at least one user-defined script on at least one other infrastructure management device over the network, executing at least one user-defined program on at least one other infrastructure management device over the network, executing at least one user-defined command on the infrastructure management device locally, executing at least one user-defined script the infrastructure management device locally, executing at least one user-defined program on the at least one infrastructure management device locally, performing a serial console connection over at least one communications interface, performing a serial virtual machine console connection over at least one communications interface, performing a SOL (Serial-Over-Lan) console connection over at least one communications interface, performing a KVM (Keyboard-Video-Mouse) console connection over at least one communications interface, performing a MKS (Mouse-Keyboard-Screen) virtual machine console connection over at least one communications interface, performing a power command on at least one IT device over at least one communications interface, establishing a TCI/IP tunnel between the user's workstation and the infrastructure management device, performing access rights control on commands, performing data log collection on an IT device data session, performing alert and notification based on configuration and data log collection from at least one of the at least one IT device, performing authentication and authorization to a user based on at least on one of the following: command, user group and IT device, a combination of the above, and/or the like.

In a second example, an IT device action(s) may be performed by: communicating with at least one IT device in order to verify a device IT state, communicating with at least one IT device in order to cause a change of the device IT state, a combination of the above, and/or the like. For further clarification, an IT device state may include one of the following: an IT device power state, an IT device console session state, an IT device login credential state, an IT device configuration state, an IT device Operating System (OS) state, an IT device firmware state, an IT device hosted application state, a combination of the above, and/or the like.

Figure 8:
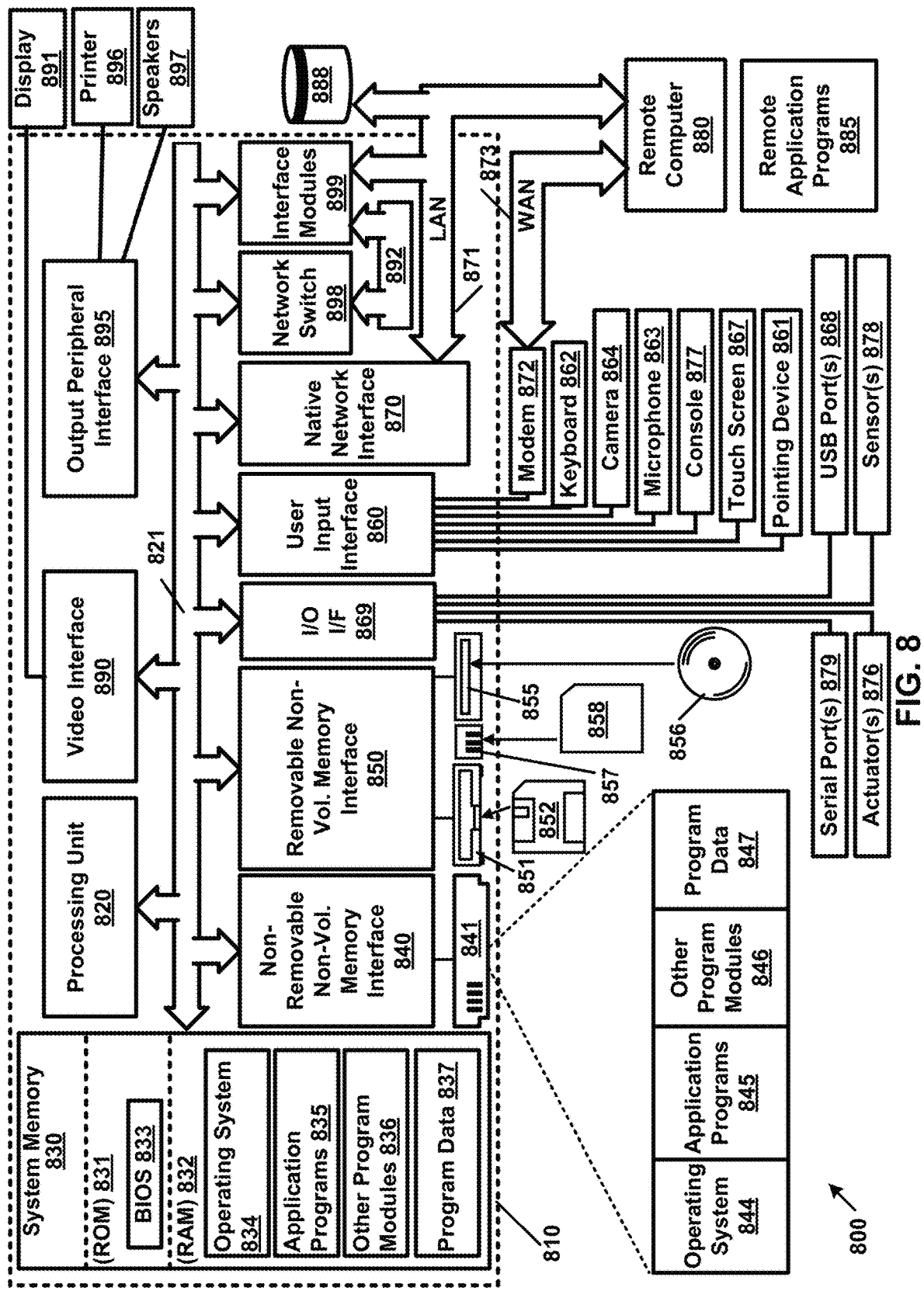
FIG. 8 illustrates an exemplary computing system environment.

FIG. 8 illustrates an exemplary computing system environment 800. The computing system environment 800 is only one example of a suitable computing environment and is not intended to suggest any limitation as to the scope of use or functionality of the claimed subject matter. Neither should the computing environment 800 be interpreted as having any dependency or requirement relating to any one or combination of components illustrated in the exemplary operating environment 800.

Embodiments are operational with numerous other general purpose or special purpose computing system environments or configurations. Examples of well-known computing systems, environments, and/or configurations that may be suitable for use with various embodiments include, but are not limited to, embedded computing systems, personal computers, server computers, hand-held or laptop devices, multiprocessor systems, microprocessor-based systems, set top boxes, programmable consumer electronics, network PCs, minicomputers, mainframe computers, cloud services, telephony systems, distributed computing environments that include any of the above systems or devices, and the like.

Embodiments may be described in the general context of computer-executable instructions, such as program modules, being executed by computing capable devices. Generally, program modules include routines, programs, objects, components, data structures, etc. that perform particular tasks or implement particular abstract data types. Some embodiments may be designed to be practiced in distributed computing environments where tasks are performed by remote processing devices that are linked through a communications network. In a distributed computing environment, program modules may be located in both local and remote computer storage media including memory storage devices.

With reference to FIG. 8, an example system for implementing some embodiments includes a computing device 810. Components of computer 810 may include, but are not limited to, a processing unit 820, a system memory 830, and a system bus 821 that couples various system components including the system memory to the processing unit 820.

Computer 810 typically includes a variety of computer-readable media. Computer-readable media can be any available media that can be accessed by computer 810 and includes both volatile and nonvolatile media, and removable and non-removable media. By way of example, and not limitation, computer readable media may comprise computer storage media and communication media. Computer storage media includes both volatile and nonvolatile, and removable and non-removable media implemented in any method or technology for storage of information such as computer readable instructions, data structures, program modules or other data. Computer storage media includes, but is not limited to, random access memory (RAM), read-only memory (ROM), electrically erasable programmable read-only memory (EEPROM), flash memory or other memory technology, compact disc read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by computer 810. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer readable media.

The system memory 830 includes computer storage media in the form of volatile and/or non-volatile memory such as ROM 831 and RAM 832. A basic input/output system 833 (BIOS), containing the basic routines that help to transfer information between elements within computer 810, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, application programs 835, other program modules 836, and program data 837.

The computer 810 may also include other removable/non-removable volatile/non-volatile computer storage media. By way of example only, FIG. 8 illustrates a hard disk drive 841 that reads from or writes to non-removable, non-volatile magnetic media, a magnetic disk drive 851 that reads from or writes to a removable, non-volatile magnetic disk 852, a flash drive reader 857 that reads flash drive 858, and an optical disk drive 855 that reads from or writes to a removable, non-volatile optical disk 856 such as a CD ROM or other optical media. Other removable/non-removable, volatile/non-volatile computer storage media that can be used in the exemplary operating environment include, but are not limited to, magnetic tape cassettes, flash memory cards, digital versatile disks, digital video tape, solid state RAM, solid state ROM, and the like. The hard disk drive 841 is typically connected to the system bus 821 through a non-removable memory interface such as interface 840, and magnetic disk drive 851 and optical disk drive 855 are typically connected to the system bus 821 by a removable memory interface, such as interface 850.

The drives and their associated computer storage media discussed above and illustrated in FIG. 8 provide storage of computer-readable instructions, data structures, program modules and other data for the computer 810. In FIG. 8, for example, hard disk drive 841 is illustrated as storing operating system 844, application programs 845, program data 847, and other program modules 846. Additionally, for example, non-volatile memory may include instructions to, for example, discover and configure IT device(s), the creation of device neutral user interface command(s), combinations thereof, and/or the like.

A user may enter commands and information into the computer 810 through input devices such as a keyboard 862, a microphone 863, a camera 864, a touch screen 867, console 877 and a pointing device 861, such as a mouse, trackball or touch pad. These and other input devices are often connected to the processing unit 820 through a user input interface 860 that is coupled to the system bus, but may be connected by other interface and bus structures, such as a parallel port, game port or a universal serial bus (USB). A monitor display 891 or other type of display device may also be connected to the system bus 821 via an interface, such as a video interface 890. Other devices, such as, for example, speakers 897 and printer 896 may be connected to the system via peripheral interface 895.

The computer 810 may also include other input/output devices such as serial port(s) 879, USB port(s) 868, sensor(s) 878 and actuator(s) 876 that may be used to interact with IT devices. These and other input/output devices are often connected to the processing unit 820 through an Input/Output Interface (I/O I/F) 869 coupled to the system bus, but may also be connected by other interface and bus structures. Examples of the serial communication interfaces may comprise, but are not limited to: RS-232 serial port(s), and RS-485 serial port(s). Serial port(s) 879 may be implemented in many physical formats, such as, for example DB9, DB25, RJ11, RJ45, and twisted pair (like RS-422).

The computer 810 may also include a network switch 898 and interface modules 899. The network switch 898 and interface modules 899 may be connected by data plane 892 and by the system bus 821. The system bus 821 may also function as the control plane. The interface modules 899 may provide connectivity to the removably inserted communication card modules.

The computer 810 may be operated in a networked environment using logical connections to one or more remote computers, such as a remote computer 880. The remote computer 880 may be a personal computer, a hand-held device, a server, a router, a network PC, a peer device or other common network node, and typically includes many or all of the elements described above relative to the computer 810. The logical connections depicted in FIG. 8 include a Local Area Network (LAN) 871 and a Wide Area Network (WAN) 873, but may also include other networks. Such networking environments are commonplace in offices, enterprise-wide computer networks, intranets and the Internet.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the Internet. The modem 872, which may be internal or external, may be connected to the system bus 821 via the user input interface 860, or other appropriate mechanism. The modem 872 may be wired or wireless. Examples of wireless devices may comprise, but are limited to: Wi-Fi, cellular and Bluetooth™. In a networked environment, program modules depicted relative to the computer 810, or portions thereof, may be stored in the remote memory storage device. By way of example, and not limitation, FIG. 8 illustrates remote application programs 885 as residing on remote computer 880. It will be appreciated that the network connections shown are exemplary and other means of establishing a communications link between the computers may be used. Additionally, for example, LAN 871 and WAN 873 may provide a network interface to communicate with other distributed infrastructure management device(s), with IT device(s) (e.g. network disk drive 888), with users remotely accessing the User Input Interface 860, Input/Output Interface 869, combinations thereof, and/or the like.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

In this specification, "a" and "an" and similar phrases are to be interpreted as "at least one" and "one or more". References to "an" embodiment in this disclosure are not necessarily to the same embodiment.

Many of the elements described in the disclosed embodiments may be implemented as modules. A module is defined here as an isolatable element that performs a defined function and has a defined interface to other elements. The modules described in this disclosure may be implemented in hardware, a combination of hardware and software, firmware, wetware (i.e. hardware with a biological element) or a combination thereof, all of which are behaviorally equivalent. For example, modules may be implemented using computer hardware in combination with software routine(s) written in a computer language (Java, HTML, XML, PHP, Python, ActionScript, JavaScript, Ruby, Prolog, SQL, VBScript, Visual Basic, Perl, C, C++, Objective-C or the like). Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs), field programmable gate arrays (FPGAs), and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies may be used in combination to achieve the result of a functional module.

Some embodiments may employ processing hardware. Processing hardware may include one or more processors, computer equipment, embedded systems, machines a combination thereof, and/or the like. The processing hardware may be configured to execute instructions. The instructions may be stored on a machine-readable medium. According to some embodiments, the machine-readable medium (e.g. automated data medium) may be a medium configured to store data in a machine-readable format that may be accessed by an automated sensing device. Examples of machine-readable media include: magnetic disks, cards, tapes, and drums, flash memory, memory cards, electrically erasable programmable read-only memory (EEPROM), solid state drives, optical disks, barcodes, magnetic ink characters, a combination thereof, and/or the like.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments. In particular, it should be noted that, for example purposes, the presently described embodiments are discussed with respect to a data center. However, one skilled in the art will recognize that embodiments may be employed to other collections of IT devices over, for example, a distributed network not confined by a single data center, a small collection of IT devices in an Intranet, combinations thereof, and/or the like.

In addition, it should be understood that any figures that highlight any functionality and/or advantages, are presented for example purposes only. The disclosed architecture is sufficiently flexible and configurable, such that it may be utilized in ways other than that shown. For example, the steps listed in any flowchart may be re-ordered or only optionally used in some embodiments.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope in any way.

Finally, it is the applicant's intent that only claims that include the express language "means for" or "step for" be interpreted under 35 U.S.C. 112. Claims that do not expressly include the phrase "means for" or "step for" are not to be interpreted under 35 U.S.C. 112.

What is claimed is:

1. A modular infrastructure management device comprising:
    a housing including,
        a base plate comprising,
            first and second edges, wherein the first and second edges are parallel, and
            third and fourth edges, wherein the third and fourth edges are parallel and perpendicular to the first and second edges,
        first modular slots disposed along the first edge of the base plate for removably receiving at least one first communication card module, wherein a single one of the at least one first communication card module is removably inserted into two or more of the first modular slots, and
        second modular slots disposed along the second edge of the base plate for removably receiving at least one second communication card module; and
    at least one first circuit board disposed on the base plate, wherein the first circuit board comprises first and second connectors for electrically coupling to the first and second communication card modules, wherein the at least one first circuit board comprises a central processing unit and a network switch, wherein the first or second connector comprises one or more pins that are electrically disconnected and physically connected with the at least one first or second communication card module while the at least one first or second communication card module is removably inserted into the first or second modular slots.

2. The modular infrastructure management device of claim 1 wherein the first and second modular slots comprise a common width.

3. The modular infrastructure management device of claim 1 wherein the first modular slots comprise three first modular slots and the second modular slots comprise two second modular slots.

4. The modular infrastructure management device of claim 1 wherein the first and second connectors comprise pins that are assigned same functions when located in same positions, wherein the at least one second communication card module provides functionalities that are different from the at least one first communication card module.

23

5. The modular infrastructure management device of claim 1 wherein the first and second connectors comprise 120-pin connectors.

6. The modular infrastructure management device of claim 1 further comprises the second communication card module removably inserted into a single one of the second modular slots.

7. The modular infrastructure management device of claim 1 further comprises the second communication card module is removably inserted into half of the second modular slots.

8. The modular infrastructure management device of claim 1 wherein each of the first and second communication card modules comprises:
   at least one second circuit board having fifth, sixth, seventh and eighth edges, wherein the fifth and sixth edges are parallel to each other, wherein the seventh and eighth edges are parallel to each other and perpendicular to the fifth and sixth edges;
   a face plate disposed along the fifth edge and perpendicular to the second circuit board, wherein the face plate is aligned along the first or second edge of the base plate while the first or second communication card module is removably inserted into at least one of the first or second modular slots; and
   an edge contact disposed along the sixth edge for electrically contacting a corresponding one of the first or second connectors on the first circuit board.

9. The modular infrastructure management device of claim 8 wherein the face plate comprises a first width that is a multiple of a second width of the first or second modular slot.

10. The modular infrastructure management device of claim 9 wherein the first width comprises two times of the second width.

11. The modular infrastructure management device of claim 8 wherein the face plate comprises one or more communication interfaces.

12. The modular infrastructure management device of claim 11 wherein the one or more communication interfaces comprise:
   one or more null-modem serial ports;
   one or more Data Communications Equipment (DCE) serial ports;
   one or more Data Terminal Equipment (DTE) serial ports;
   one or more Cisco pinout serial ports;
   one or more Cyclades pinout serial ports;
   one or more straight-through serial ports;
   one or more cross-over serial ports;
   one or more RJ45 ports;
   one or more RS-232 serial ports;
   one or more RS-485 serial ports;
   one or more Universal Serial Bus (USB) ports;
   one or more serial ports;
   one or more Local Area Network (LAN) ports;
   one or more Wide Area Network (WAN) ports;
   one or more Wi-Fi wireless Network ports;
   one or more input-output (I/O) ports;
   one or more Ethernet ports;
   one or more cellular; or
   a combination thereof.

13. The modular infrastructure management device of claim 11 wherein the first circuit board comprises a carrier input/output (I/O) board with an I/O interface, wherein the I/O interface is configured to logically map I/O signals received from the one or more communication interfaces when external devices are coupled thereto.

24

14. The modular infrastructure management device of claim 1 wherein the first or second communication card module comprises:
   a 16-port gigabit Ethernet (GbE) module;
   an 8-port GbE module;
   a 16-port serial module;
   a compute module;
   an M.2 module;
   a 16-port Universal Serial Bus (USB) module;
   a storage module;
   an 8-port small form factor pluggable (SFP+) module;
   a 16-port SFP+ module;
   an 8-port GbE Power over Ethernet (PoE+) module;
   an outlet module;
   a power module;
   a 32-port serial module;
   a 48-port serial module;
   a 32-port network module;
   a 48-port network module; or
   a combination thereof.

15. The modular infrastructure management device of claim 1 wherein the first circuit board comprises the central processing unit that provides a control plane that extends over at least some of the first and second modular slots.

16. The modular infrastructure management device of claim 1 wherein the first circuit board comprises the network switch that provides a data plane that extends over at least some of the first or second modular slots.

17. The modular infrastructure management device of claim 1 wherein the first circuit board comprises the central processing unit in communication with one or more non-transitory media, wherein the one or more non-transitory media include instructions executable by the central processing unit to discover, cluster, index, create exchange index table, search and take action on at least one external device coupled to the modular infrastructure management device.

18. The modular infrastructure management device of claim 17 wherein the one or more non-transitory media comprises a configuration and management engine executable by the central processing unit to provide a user interface to facilitate configuring and managing external devices coupled to the modular infrastructure management device using a configuration service.

19. A modular communication infrastructure management device comprising:
   a housing comprising,
      a base plate comprising,
         first and second edges, wherein the first and second edges are parallel, and
         third and fourth edges, wherein the third and fourth edges are parallel and perpendicular to the first and second edges,
      modular slots disposed along the first edge of the base plate for removably receiving at least one communication card module, wherein a single one of the at least one communication card module is removably inserted into two or more of the modular slots; and
      at least one circuit board disposed on the base plate, wherein the circuit board comprises connectors for electrically coupling to the at least one communication card module, wherein the at least one circuit board comprises a central processing unit and a network switch, wherein the connectors comprise one or more pins that are electrically disconnected and physically connected with the at least one communication card module while the at least one communication card module is removably inserted into at least one of the modular slots, wherein the modular communication infrastructure management device is configured to manage one or more external devices connected, via one or more communication interfaces, to the modular communication infrastructure management device through the at least one communication card module.

\* \* \* \* \*